United States Patent
Jin et al.

(10) Patent No.: US 9,343,492 B2
(45) Date of Patent: May 17, 2016

(54) CMOS IMAGE SENSOR BASED ON THIN-FILM ON ASIC AND OPERATING METHOD THEREOF

(71) Applicant: Samsung Electronics Co., Ltd., Suwon-Si, Gyeonggi-Do (KR)

(72) Inventors: Young-Gu Jin, Osan-si (KR); Dong-Ki Min, Seoul (KR); Hirosige Goto, Suwon-si (KR); Tae-Chan Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/584,273

(22) Filed: Dec. 29, 2014

(65) Prior Publication Data

US 2015/0189200 A1    Jul. 2, 2015

(30) Foreign Application Priority Data

Dec. 30, 2013    (KR) .......................... 10-2013-0167009

(51) Int. Cl.
| | | |
|---|---|---|
| *H01L 31/0232* | (2014.01) | |
| *H01L 27/146* | (2006.01) | |
| *H04N 9/04* | (2006.01) | |
| *H04N 13/02* | (2006.01) | |
| *H04N 5/3745* | (2011.01) | |

(52) U.S. Cl.
CPC .... *H01L 27/14627* (2013.01); *H01L 27/14609* (2013.01); *H01L 27/14621* (2013.01); *H01L 27/14629* (2013.01); *H01L 27/14643* (2013.01); *H01L 27/14665* (2013.01); *H04N 5/3745* (2013.01); *H04N 9/045* (2013.01); *H04N 13/0207* (2013.01)

(58) Field of Classification Search
CPC ............ H01L 27/307; H01L 27/14605; H01L 27/14643; H01L 27/3234
USPC ............ 257/432, E27.133, E27.141, E31.127
See application file for complete search history.

(56) References Cited

U.S. PATENT DOCUMENTS

| | | |
|---|---|---|
| 7,701,023 B2 | 4/2010 | Rieve et al. |
| 8,223,234 B2 | 7/2012 | Inuiya |
| 8,237,834 B2 | 8/2012 | Inuiya |
| 8,440,493 B2 | 5/2013 | Toyoda |
| 2008/0225142 A1 | 9/2008 | Goto |
| 2010/0193848 A1* | 8/2010 | Lee .................. H01L 27/14667 257/294 |

(Continued)

FOREIGN PATENT DOCUMENTS

| | | |
|---|---|---|
| JP | 2010067827 A | 3/2010 |
| JP | 2011103335 A | 5/2011 |

(Continued)

*Primary Examiner* — Brook Kebede
(74) *Attorney, Agent, or Firm* — Harness, Dickey & Pierce, P.L.C.

(57) ABSTRACT

Provided are a complementary metal-oxide semiconductor (CMOS) image sensor based on a thin-film-on-application specific integrated circuit (TFA), and a method of operating the same. The CMOS image sensor may include at least one floating diffusion region formed in a semiconductor substrate, and a thin film type light sensor disposed to correspond to a plurality of pixels. The CMOS image sensor may also include at least one via electrically connected between the light sensor and the at least one floating diffusion region. The CMOS image sensor may also include a first micro lens disposed to correspond to at least two pixels of the plurality of pixels.

20 Claims, 13 Drawing Sheets

(56) References Cited

U.S. PATENT DOCUMENTS

| | | |
|---|---|---|
| 2010/0245638 A1 | 9/2010 | Ota |
| 2011/0109776 A1 | 5/2011 | Kawai |
| 2013/0075851 A1* | 3/2013 | Terai ............ H01L 27/14621 257/432 |
| 2013/0093911 A1 | 4/2013 | Sul et al. |
| 2014/0051993 A1 | 2/2014 | McGee |

FOREIGN PATENT DOCUMENTS

| | | |
|---|---|---|
| JP | 2011238781 A | 11/2011 |
| JP | 2011249623 A | 12/2011 |
| KR | 100850289 B1 | 8/2008 |
| KR | 20100108263 A | 10/2010 |
| KR | 20110052256 A | 5/2011 |
| KR | 20130041418 A | 4/2013 |

* cited by examiner

2x2 sub-pixel

3x3 sub-pixel

4x4 sub-pixel

2x2 pixel

3x3 pixel

4x4 pixel

_US 9,343,492 B2_

CMOS IMAGE SENSOR BASED ON THIN-FILM ON ASIC AND OPERATING METHOD THEREOF

CROSS-REFERENCE TO RELATED APPLICATIONS

This application claims the benefit of Korean Patent Application No. 10-2013-0167009, filed on Dec. 30, 2013, in the Korean Intellectual Property Office, the disclosure of which is incorporated herein in its entirety by reference.

BACKGROUND

Inventive concepts relate to complementary metal-oxide semiconductor (CMOS) image sensors (CISs), and more particularly, to a CIS based on a thin-film-on-application specific integrated circuit (TFA) and a method of operating the same.

In general, a CIS used as a solid-state imaging device is configured to transform an external optical image signal into an electrical image signal. A CIS may be operated with a low voltage, consume low power, and be advantageous in terms of integration, compared to a charge-coupled device (CCD). Thus, the CIS is used in various fields. The CIS may include a pixel array having a plurality of pixels, and each of the plurality of pixels includes a photodiode that serves as a photosensor and generates an electrical signal according to the intensity of light.

However, crosstalk components may increase due to the thickness of the photosensor when the photosensor is formed, and thus, an image may be distorted when a signal containing the crosstalk components is processed. Also, a general CIS has limited lens designs, and thus, it may be difficult to secure the precision of depth information calculated to form a three-dimensional (3D) image.

SUMMARY

Inventive concepts provide a thin-film-on-application specific integrated circuit (TFA)-based complementary metal-oxide semiconductor (CMOS) image sensor capable of increasing the precision of image formation by decreasing crosstalk components and/or efficiently generating depth information for producing a three-dimensional (3D) image, and/or a method of operating the same.

According to at least one example embodiment, a CMOS image sensor may include at least one floating diffusion region formed in a semiconductor substrate, and a thin film type light sensor disposed to correspond to a plurality of pixels. The CMOS image sensor may also include at least one via electrically connected between the light sensor and the at least one floating diffusion region. The CMOS image sensor may also include a first micro lens disposed to correspond to at least two pixels of the plurality of pixels.

According to at least one example embodiment, the CMOS image sensor also includes a color filter array disposed to correspond to the plurality of pixels.

According to at least one example embodiment, the at least two pixels corresponding to the first micro lens include a first sub-pixel and a second sub-pixel sensing the same color of light, and pixel signals from the first and second sub-pixels are used to calculate depth information.

According to at least one example embodiment, the at least two pixels include 'n' sub-pixels disposed to correspond to the first micro lens, wherein 'n' denotes an integer that is equal to or greater than '2'. The at least one via includes 'n' vias disposed to correspond to the 'n' sub-pixels, respectively.

According to at least one example embodiment, the at least two pixels form a filter group, and the filter group includes a first filter and a second filter that pass the same color of light.

According to at least one example embodiment, the at least one via includes a plurality of vias disposed to correspond to a plurality of filters belonging to the filter group, respectively.

According to at least one example embodiment, the filter group includes n×n pixels, wherein 'n' denotes an integer that is equal to or greater than '2'.

According to at least one example embodiment, the n×n pixels have a Bayer pattern including red, green, and blue filters.

According to at least one example embodiment, the CMOS image sensor further comprises a second micro lens disposed to correspond to at least two different pixels of the plurality of pixels. The at least two pixels corresponding to the first micro lens include filters for passing a first color of light, and the at least two different pixels corresponding to the second micro lens include filters for passing a second color of light.

According to at least one example embodiment, the CMOS image sensor includes a second micro lens disposed to correspond to at least two different pixels of the plurality of pixels. A color pattern of the at least two pixels corresponding to the first micro lens is the same as a color pattern of the at least two different pixels corresponding to the second micro lens.

According to at least one example embodiment, 'n' pixels are disposed to correspond to the first micro lens, wherein 'n' denotes an integer that is equal or greater than '2', and pixels signals from pixels sensing the same color among the 'n' pixels are used to calculate depth information.

According to at least one example embodiment, method of operating a complementary metal-oxide semiconductor (CMOS) image sensor includes providing light charges, which are accumulated in a thin film type light sensor when light passes through a first micro lens and a first filter, to a first floating diffusion region through a first via. The thin film type light sensor may be disposed to correspond to a plurality of pixels. The method includes providing light charges, which are accumulated in the thin film type light sensor when light passes through the first micro lens and a second filter, to a second floating diffusion region through a second via. The method includes generating a first pixel signal corresponding to the light charges accumulated in the first floating diffusion region, and a second pixel signal corresponding to the light charges accumulated in the second floating diffusion region. The method also includes calculating depth information based on the first and second pixel signals.

According to at least one example embodiment, the first and second filters are filters for passing a first color of light.

According to at least one example embodiment, at least one of the first and second filters is further disposed to correspond to the first micro lens and to pass a second color of light that is different from the first color of light.

According to at least one example embodiment, at least one of the plurality of pixels includes a plurality of sub-pixels, and the first and second filters correspond to a first sub-pixel and a second sub-pixel of the at least one pixel, respectively.

According to at least one example embodiment, an image sensor includes a substrate including a first charge collection region and a second charge collection region. The first charge collection region is configured to collect first charges, and the second charge collection region is configured to collect second charges. The image sensor includes a light sensor on the first and second charge collection regions and configured to generate the first and second charges based on incident light.

The image sensor includes a first micro lens on the light sensor and aligned with the first and second charge collection regions.

According to at least one example embodiment, the image sensor further includes a first conductive plug electrically connecting the light sensor to the first charge collection region; and a second conductive plug electrically connecting the light sensor to the second charge collection region.

According to at least one example embodiment, the first charge collection region is associated with a first pixel configured to detect a first color of light, and the second charge collection region is associated with a second pixel configured to detect a second color of light, different from the first color of light.

According to at least one example embodiment, the first charge collection region is associated with a first sub-pixel and the second charge collection region is associated with a second sub-pixel The first and second sub-pixels are configured to detect a same color of light.

According to at least one example embodiment, the image sensor includes an image signal processor configured to receive a first pixel signal based on the first charges collected by first charge collection region and a second pixel signal based on the second charges collected by the second charge collection region. The image signal process is also configured to calculate depth information based on the received first and second pixel signals.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
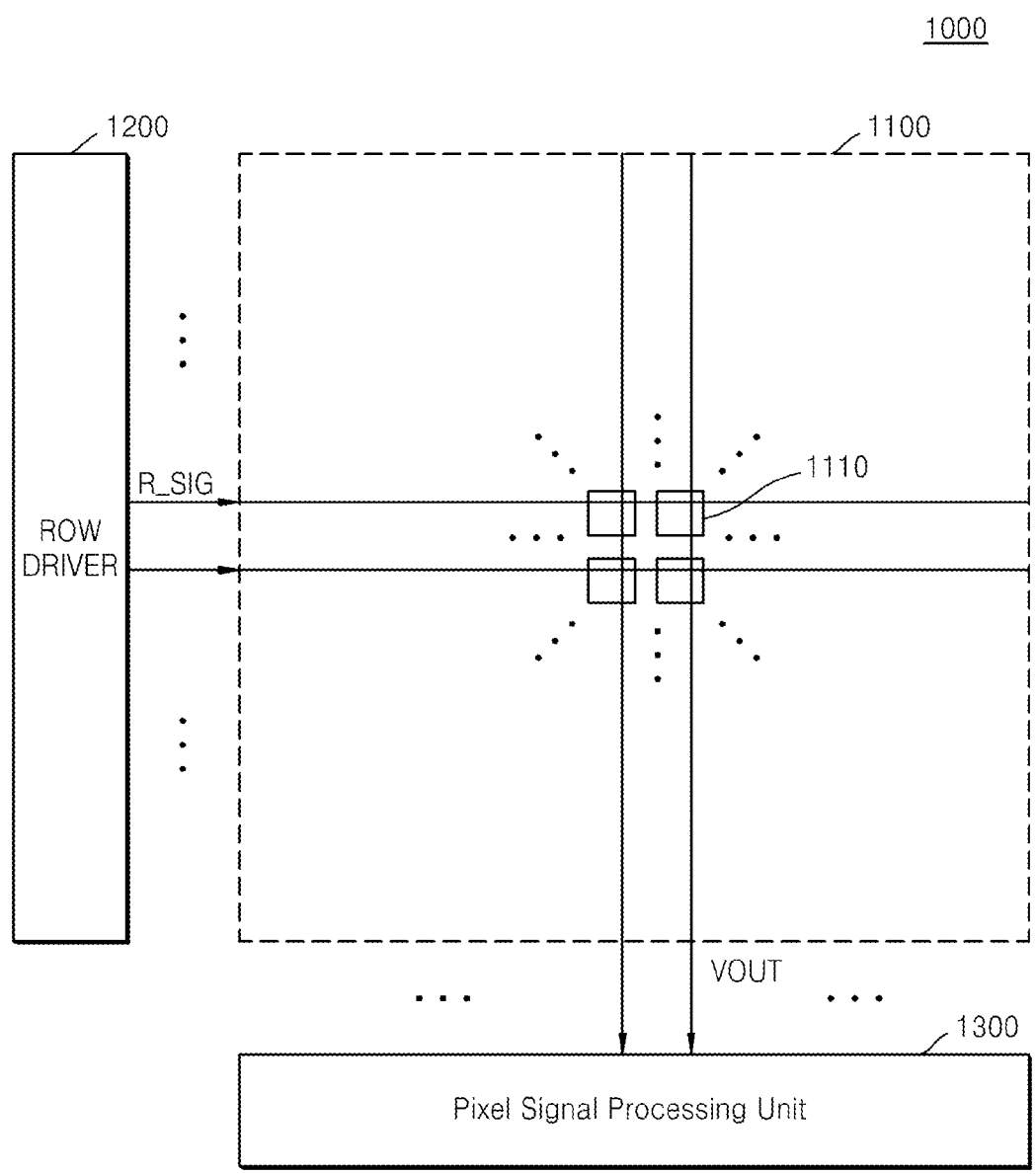
FIG. 1 is a block diagram of a complementary metal-oxide semiconductor (CMOS) image sensor (CIS) according to at least one example embodiment of inventive concepts.

Inventive concepts will now be described more fully with reference to the accompanying drawings, in which example embodiments of are shown. These example embodiments are provided so that this disclosure will be thorough and complete, and will fully convey inventive concepts of to those skilled in the art. Inventive concepts may be embodied in many different forms with a variety of modifications, and a few embodiments will be illustrated in drawings and explained in detail. However, this should not be construed as being limited to example embodiments set forth herein, and rather, it should be understood that changes may be made in these example embodiments without departing from the principles and spirit of inventive concepts, the scope of which are defined in the claims and their equivalents. Like numbers refer to like elements throughout. In the drawings, the thicknesses of layers and regions are exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., electronic imaging systems, image processing systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram of a complementary metal-oxide semiconductor (CMOS) image sensor (CIS) 1000 according to at least one example embodiment of inventive concepts. Referring to FIG. 1, the CIS 1000 may include a pixel array 1100, a row driver 1200, and a pixel signal processing unit 1300. The pixel array 1100 may include a plurality of pixels 1110 arranged in a matrix. The row driver 1200 may output a row signal R_SIG. When the row signal R_SIG is input to the pixel array 1100, at least one pixel 1110 may be selected.

An output voltage VOUT output from at least one pixel 1110 included in the pixel array 1100 may be input as a pixel signal to the pixel signal processing unit 1300. Pixels 1110 that form one row of the pixel array 1100 may share the same row signal R_SIG, and pixels 1110 that form one column of the pixel array 1100 may share a signal line via which an output voltage VOUT is output. The amount of light sensed by each of the pixels 1110 may be detected by processing a signal for the output voltage VOUT.

The pixel signal processing unit 1300 may receive the output voltage VOUT of the pixel array 1100 as a pixel signal and calculate a color signal and depth information by processing the pixel signal. According to at least one example embodiment of inventive concepts, a micro lens is arranged to correspond to at least two pixels (or at least two sub-pixels), and the color signal and the depth information may be calculated by processing pixel signals corresponding to the at least two pixels.

Figure 2:
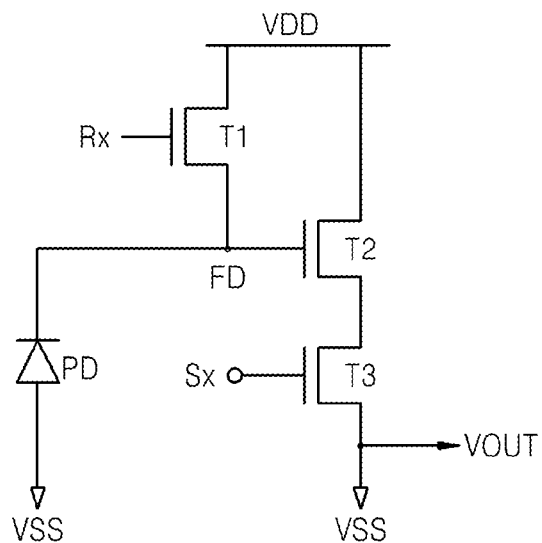
FIG. 2 is a circuit diagram of a unit pixel of a general CIS.

FIG. 2 is a circuit diagram of a unit pixel of a general CIS. The unit pixel may be embodied in various forms. FIG. 2 illustrates a unit pixel having a three-transistor structure. As illustrated in FIG. 2, each pixel 1110 included in a pixel array may include a light sensor (e.g., a photodiode PD) that receives light and generates light charges from the light, and a plurality of transistors, namely, a reset transistor T1, a drive transistor T2, and a selection transistor T3.

Light charges accumulated in the photodiode PD are provided to a floating diffusion region FD (or charge collection region). The light charges may be accumulated with or without the use of a capacitor connected between the floating diffusion region FD and a ground voltage. For example, in the event that the light sensor comprises a transistor type photo sensor having an oxide semiconductor material, a capacitor may be excluded from the pixel circuit of FIG. 2. In a four-transistor structure, light charges may be provided to a floating diffusion region FD based on a turning-on operation of a transfer transistor between the photodiode PD and the floating diffusion region FD. The reset transistor T1 resets an electric potential of the floating diffusion region FD to a desired (or alternatively, predetermined) power supply voltage VDD according to a reset signal Rx.

The drive transistor T2 functions as a source follower-buffer amplifier. The selection transistor T3 is used for addressing purposes and may be switched on to apply an output voltage VOUT of each unit pixel 1110 as a pixel signal to the pixel signal processing unit 1300 of FIG. 1 via an output terminal OUT thereof, in response to a selection control signal Sx.

Figure 3:
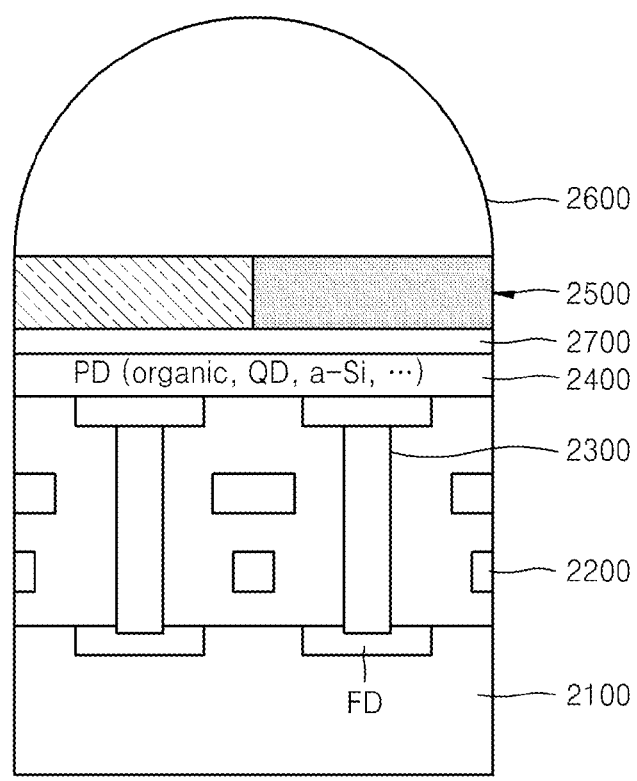
FIG. 3 is a diagram illustrating the structures of pixels included in a CIS according to at least one example embodiment of inventive concepts.

FIG. 3 is a diagram illustrating the structures of pixels included in a CIS 2000 according to at least one example embodiment of inventive concepts. The pixels illustrated in FIG. 3 are pixels having a thin-film-on-application specific integrated circuit (TFA) structure, e.g., TFA pixels. The CIS 2000 may include a semiconductor substrate 2100 in which at least one floating diffusion region (or charge collection region) FD is formed, at least one electrode 2200 for transmitting a signal, a photodiode 2400, at least one via (or conductive plug) 2300 through which light charges accumulated in the photodiode 2400 are provided to the at least one floating diffusion region FD. The CIS 2000 may include a color filter 2500 for passing at least one color component of light, and a micro lens 2600 disposed on the color filter 2500. Also, a transparent electrode layer 2700 is disposed between the photodiode 2400 and the color filter 2500. A portion corresponding to one color filter may be defined as a unit pixel.

The photodiode 2400 may be provided in the form of a thin film formed of an organic material, quantum dots QD, amorphous silicon (a-Si), a compound semiconductor, etc. Light charges accumulated in the photodiode 2400 may be provided to the at least one floating diffusion region FD via the at least one via 2300. Although not shown in FIG. 3, the CIS 2000 may include a switch (not shown) for controlling an electric connection between the photodiode 2400 and the at least one floating diffusion region FD. This switch may be a transfer transistor.

Since the pixels included in the CIS 2000 have an array structure, the color filter 2500 may also have an array structure. The color filter 2500 may include a plurality of filters that allow lights of different wavelengths to pass therethrough, e.g., filters having a Bayer pattern or a non-Bayer pattern.

In an example embodiment according to FIG. 3, a structure in which a micro lens is applied to a plurality of TFA pixels is provided. As an example, one micro lens may be arranged for a plurality of pixels that sense different colors. Each of the at least one vias 2300 is disposed in a photodiode region corresponding to each of the plurality of pixels to electrically connect the photodiode regions 2400 to the at least one floating diffusion region FD. In detail, pixels that sense different colors may be disposed to correspond to (or be aligned with) one micro lens. For example, when a first color filter is disposed to correspond to a first pixel and a second color filter is disposed to correspond to a second pixel, a first via may be disposed to correspond to the first color filter and a second via may be disposed to correspond to the second color filter. Since the photodiode 2400 is provided in the form of a thin film and the micro lens 2600 is disposed on the photodiode 2400, crosstalk components between pixels may be reduced (or alternatively, minimized) and effects caused by the micro lens 2600 may be enhanced (or alternatively, maximized). Also, when the micro lens 2600 is formed to be relatively thick, optical performance may be enhanced (or alternatively, maximized).

According to at least one example embodiment of inventive concepts described above, a silicon substrate may be used to form various pixel circuits and thus functions such as a wide dynamic range (WDR), a global shutter, etc. are easily expanded. Also, crosstalk components may be reduced by reducing a thickness of a light-receiving member and disposing the micro lens 2600 that is relatively thick on the light-receiving member. Also, a three-dimensional (3D) image may be easily formed by disposing one micro lens 2600 to correspond to at least two pixels that sense the same color and extracting depth information by analyzing signals from the at least two pixels.

The transparent electrode layer 2700 may be embodied in various forms. For example, the transparent electrode layer 2700 may be formed of a thin metal, graphene, transparent conducting oxide (TCO), or the like. Also, a plurality of lower electrodes may be disposed below the photodiode 2400 to contact the at least one via 2300 to electrically connect the photodiode 2400 and the at least one floating diffusion region FD. Although FIG. 3 illustrates that only the at least one floating diffusion region FD is formed in the semiconductor substrate 2100, pixel circuits may also be disposed on the semiconductor substrate 2100. As a pixel circuit, not only the unit pixel having the three-transistor structure illustrated in FIG. 2 but also various pixel circuits may be used.

Figure 4:
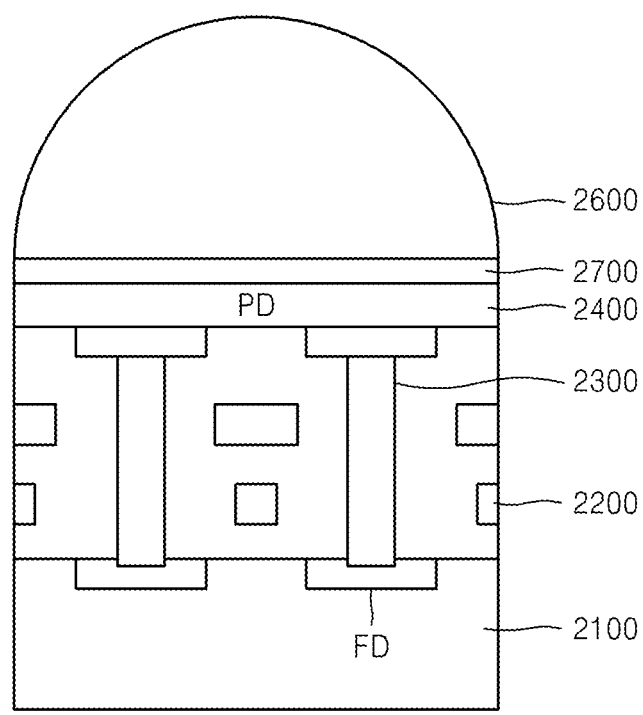
FIG. 4 is a diagram illustrating the structures of pixels included in the CIS of FIG. 3 according to at least one example embodiment of inventive concepts.

FIG. 4 is a diagram illustrating the structures of pixels included in the CIS 2000 of FIG. 3 according to at least one example embodiment of inventive concepts. If a photodiode 2400 provided in the form of a thin film has wavelength selectivity, the color filter 2500 of FIG. 3, which is capable of passing a particular wavelength component, may not be included in the CIS 2000. For example, as illustrated in FIG. 4, the photodiode 2400, a transparent electrode layer 2700, and a micro lens 2600 may be sequentially disposed. In this case, the photodiode 2400 of FIG. 4 may include at least two regions allowing lights of different wavelengths to pass therethrough. Different vias 2300 may be disposed to correspond to the at least two regions, respectively. In addition, the CIS 2000 may include at least one electrode 2200 and a semiconductor substrate 2100 in which a floating diffusion region FD is formed, similar to other example embodiments.

Figure 5:
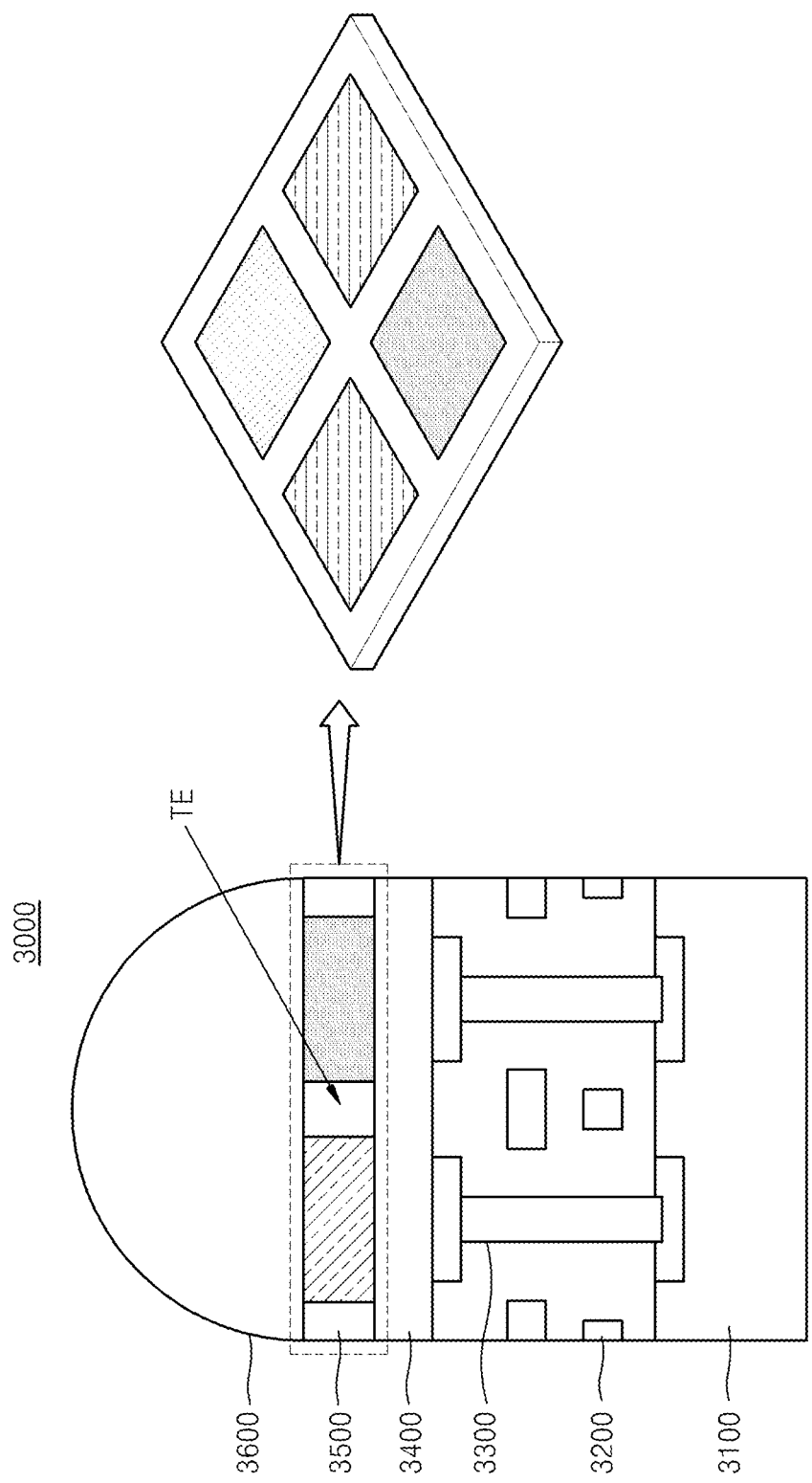
FIG. 5 is a diagram illustrating a CIS according to at least one example embodiment of inventive concepts.

FIG. 5 is a diagram illustrating a CIS 3000 according to at least one example embodiment of inventive concepts.

As illustrated in FIG. 5, the CIS 3000 includes pixels having a TFA structure, e.g., TFA pixels, a semiconductor substrate 3100 in which a floating diffusion region FD is formed, at least one electrode 3200 for transmitting a signal, a photodiode 3400, at least one via 3300, a color filter 3500 for passing at least one color component of light, and a micro lens 3600.

In FIG. 5, a combined structure of a color filter array and an upper electrode is provided. Thus, an electrode, e.g., a lattice type upper electrode TE, may be disposed between color filters. The upper electrode TE may be embodied as various devices, e.g., a non-transparent electrode. The micro lens 3600 may be disposed on a plurality of color filters, e.g., at least two color filters that pass different colors. For example, as illustrated in FIG. 5, one micro lens 3600 may be disposed to correspond to one set of 2×2 pixels. The set of 2×2 pixels may include various types of color filters. For example, RGB filters may be disposed as color filters corresponding to the 2×2 pixels.

An example embodiment of inventive concepts will now be described with respect to a case in which one micro lens 3600 is disposed to correspond to one set of 2×2 pixels. It is assumed that the set of 2×2 pixels include one red filter, one blue filter, and two green filters.

Light passing through the micro lens 3600 is provided to the photodiode 3400 via the color filters corresponding to the set of 2×2 pixels. Signal components corresponding to the respective filters may be sensed through the at least one via 3300 and the floating diffusion region FD and provided as a pixel signal. Also, two signal components of at least two pixels among the set of 2×2 pixels may be used to calculate depth information for forming a 3D image. As an example, two signal components passing through the color filters that pass a same color may be used to calculate the depth information. Thus, the depth information may be calculated based on a pixel signal corresponding to a first signal component passing through a first green filter and a pixel signal corresponding to a second signal component passing through a second green filter. The first and second signal components may correspond to pixels for sensing left and right images of a subject, respectively. It should be understood that depth information may be calculated using signal components of pixels sensing different colors (e.g., the first signal component passes through a green filter while the second signal component passes through a red filter). The first and second signal components may have asymmetric values according to the distance of a subject. For example, the depth information may be calculated by analyzing asymmetric information between the first signal component and the second signal component based on a desired (or alternatively, predetermined) reference distance in which the first signal component and the second signal component have symmetric values. In a calculation method according to at least one example embodiment, at least two pixels may have signal components (e.g., different sensitivities). The depth information may be calculated by analyzing the sensitivity of the pixels. On one hand, the first signal component and the second signal component may be said to have symmetric values when the subject is located relatively far from the pixels. This distance may be used as the reference distance. On the other hand, the first signal component and the second signal component may have increasingly asymmetric values as the subject is moved closer to the pixels. Because the degree of asymmetry between the first signal component and the second signal component increases as the subject moves closer to the pixels with respect to the reference distance, depth information about the position of the subject may be calculated by analyzing the degree of asymmetry between the two signal components.

Figure 6:
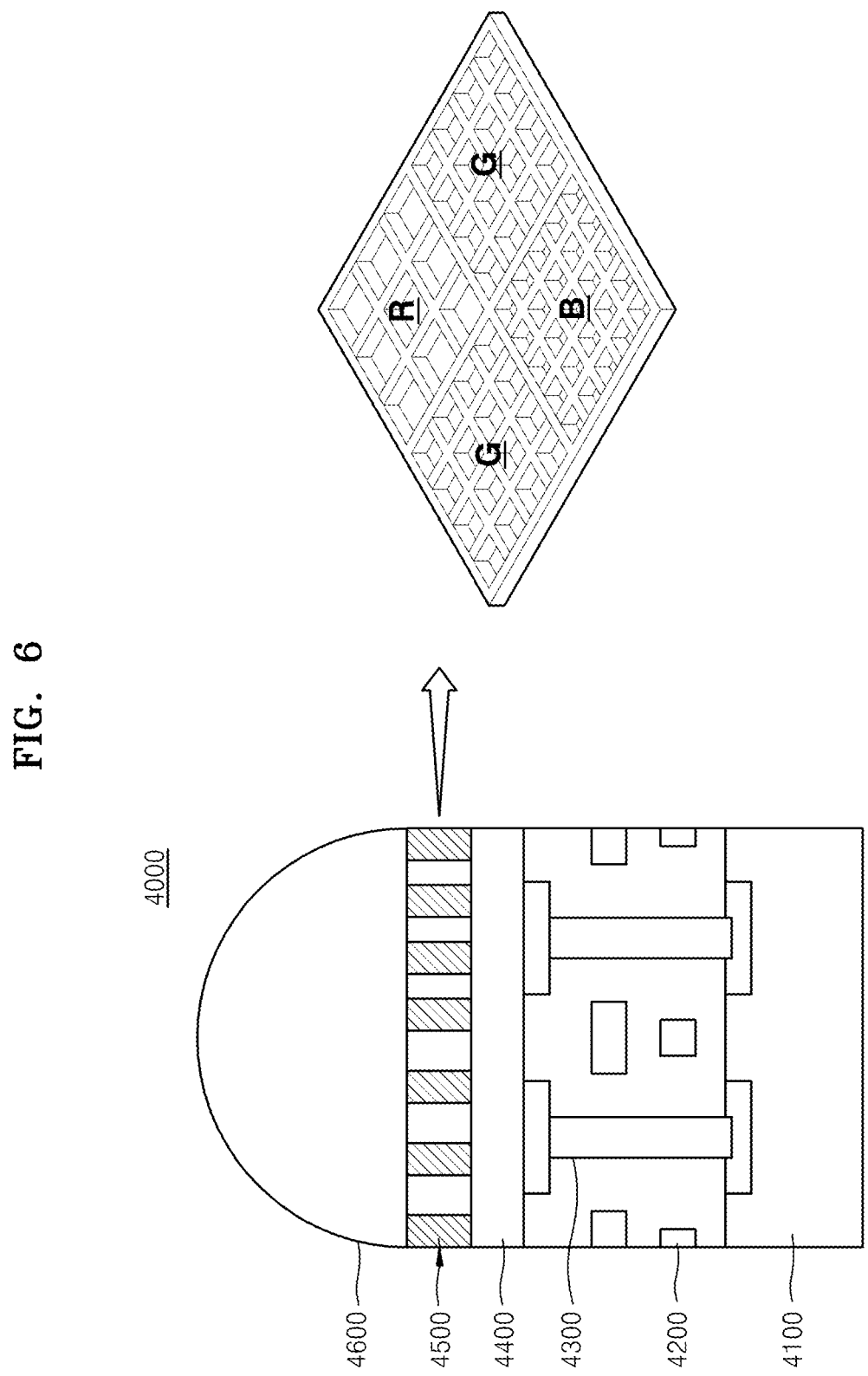
FIG. 6 is a diagram illustrating a CIS according to at least one example embodiment of inventive concepts.

FIG. 6 is a diagram illustrating a CIS 4000 according to at least one example embodiment of inventive concepts.

As illustrated in FIG. 6, the CIS 4000 may include a semiconductor substrate 4100 in which a floating diffusion region FD is formed, at least one electrode 4200 for transmitting a signal, a photodiode 4400, at least one via 4300, an electrode layer 4500, and a micro lens 4600. In FIG. 6, a plasmonic filter may be formed of a metal material without arranging an additional color filter array. The electrode layer 4500 may include a plurality of holes and be divided into a plurality of regions in which the sizes of holes and the distances between the holes may be different. Wavelength selectivity may be controlled based on the sizes of the holes and the distance between the holes. In FIG. 6, the plasmonic filter is designed to allow RGB color components to pass therethrough.

Figure 7:
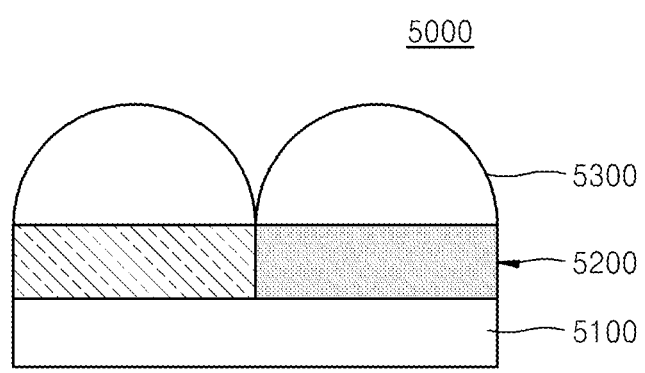
FIG. 7 is a diagram illustrating an arrangement of a color filter and a micro lens of a CIS according to at least one example embodiment of inventive concepts.

FIG. 7 is a diagram illustrating an arrangement of a color filter and a micro lens of a CIS 5000 according to at least one example embodiment of inventive concepts. As illustrated in FIG. 7, the CIS 5000 may include a photodiode 5100 provided in the form of a thin film, a color filter array 5200 that selectively allows light to pass therethrough, and at least one micro lens 5300 disposed on the color filter array 5200. In FIG. 7, a structure in which the at least one micro lens 5300 is applied to an array including a set of 2×2 or more sub-pixels is illustrated.

Figure 8A:
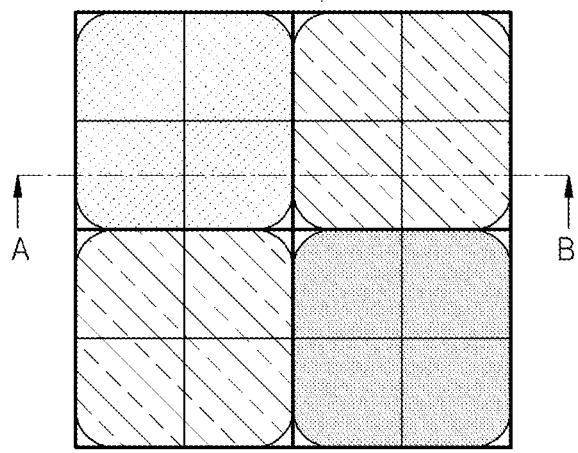
FIGS. 8A, 8B, and 8C illustrate sub-pixels according to at least one example embodiment of inventive concepts.
Figure 8B:
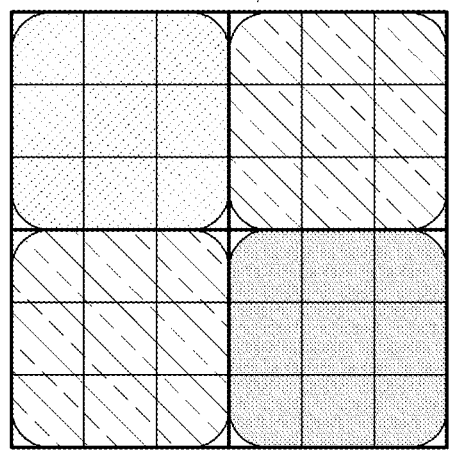
Figure 8C:
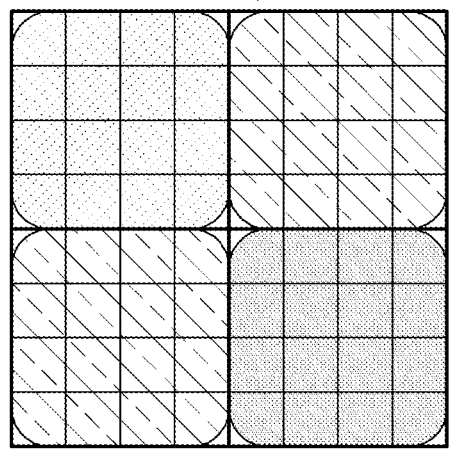

One pixel may be divided into a plurality of sub-pixels. For example, each pixel may be divided into a set of 2×2 sub-pixels, as illustrated in FIG. 8A, and/or into a set of 3×3 sub-pixels, as illustrated in FIG. 8B. Further, each pixel may be divided into a set of 4×4 sub-pixels, as illustrated in FIG. 8C. FIG. 7 illustrates a case in which each pixel is divided into a set of 2×2 sub-pixels.

One micro lens 5300 may be disposed to correspond to one pixel and be thus disposed on a plurality of sub-pixels of the pixel. Light charges may be accumulated in the photodiode 5100 when lights pass through respective sub-filters corresponding to the sub-pixels, and provided to a floating diffusion region FD through vias (not shown) disposed to correspond to the sub-filters, respectively. A pixel circuit (not shown) may be disposed to correspond to the sub-filters, and thus, four pixel signals may be generated to correspond to one pixel.

A color signal corresponding to each pixel may be calculated using at least one among four pixel signals (or four sub-pixel signals) from each pixel. As one example, when, as shown in FIG. 7, a left color filter is a red filter, all of first to fourth pixel signals corresponding to four sub-filters included in the red filter may be red color signals. Thus, a red color signal may be calculated using at least one among the first to fourth pixel signals.

To form a 3D image, depth information may be calculated by analyzing at least two pixel signals among the first to fourth pixel signals. For example, the depth information may be calculated by detecting an asymmetric degree between a pixel signal corresponding to a left sub-filter and a pixel signal corresponding to a right sub-filter among 2×2 sub-filters. In addition, a pixel signal corresponding to an upper sub-filter and a pixel signal corresponding to a lower sub-pixel among the set of 2×2 sub-filters may be further analyzed.

As illustrated in FIG. 8B, each pixel may be divided into 3×3 sub-pixels. Thus, nine pixel signals may be generated to correspond to one pixel. Similar to FIG. 8A, a color signal may be calculated using at least one pixel signal among the nine pixel signals. Also, depth information may be calculated by analyzing at least two pixel signals among the nine pixel signals. When each pixel is divided into a set 4×4 sub-pixels, as illustrated in FIG. 8C, sixteen pixel signals may be generated to correspond to one pixel and a color signal corresponding to each filter and depth information for forming a 3D image may be calculated using the sixteen pixel signals.

Figure 9:
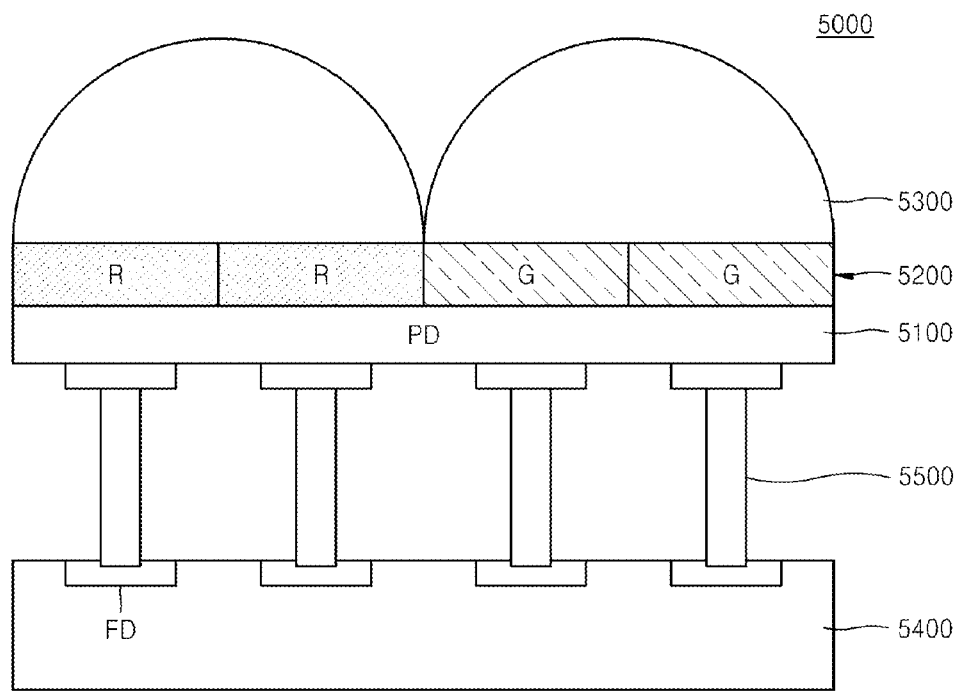
FIG. 9 illustrates an example of a cross-section of a pixel circuit of FIG. 8A.

FIG. 9 illustrates an example of a cross-section of a pixel circuit of FIG. 8A. FIG. 9 is a cross-sectional view taken along line A-B of the pixels of FIG. 8A.

As illustrated in FIG. 9, one pixel may include two or more sub-pixels. For example, FIG. 9 illustrates two red sub-pixels included in one red pixel and two green sub-pixels included in one green pixel.

A CIS 5000 of FIG. 9 may include a photodiode 5100 provided in the form of a thin film, a plurality of sub-pixels

5200, and a plurality of micro lens 5300 configured such that one of the micro lens 5300 is disposed to correspond to (or be aligned with) two or more sub-pixels. The CIS 5000 may further include a semiconductor substrate 5400 in which a floating diffusion region FD is formed, and a plurality of vias 5500 through which light charges accumulated in the photodiode 5100 are provided to the floating diffusion region FD.

As illustrated in FIG. 9, the plurality of vias 5500 may be formed to correspond to the plurality of sub-pixels 5200, respectively. For example, when light passes through the plurality of sub-pixels 5200, light charges are accumulated in the photodiode 5100 and provided to the floating diffusion region FD through the plurality of vias 5500, respectively. Output voltages may be generated to correspond to first and second pixel signals corresponding to first and second red sub-pixels, and output voltages may be generated to correspond to third and fourth pixel signals corresponding to first and second green sub-pixels. A color signal and depth information corresponding to a red pixel may be calculated using the first and second pixel signals, and a color signal and depth information corresponding to a green pixel may be calculated using the third and fourth pixel signals.

Figure 10:
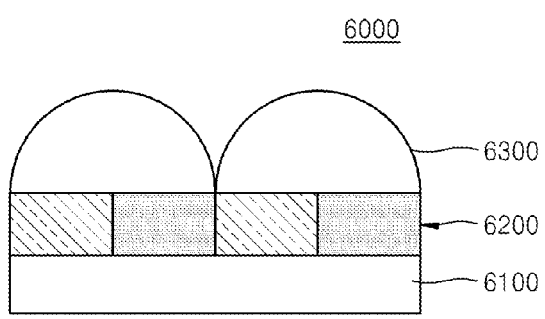
FIG. 10 is a diagram illustrating an arrangement of a color filter and a micro lens according to at least one example embodiment of inventive concepts.

FIG. 10 is a diagram illustrating an arrangement of a color filter and a micro lens according to at least one example embodiment of inventive concepts. As illustrated in FIG. 10, a CIS 6000 according to at least one example embodiment of inventive concepts may include a photodiode 6100 provided in the form of a thin film, a color filter array 6200 that selectively allows light to pass therethrough, and at least one micro lens 6300 disposed on the color filter array 6200.

Figure 11A:
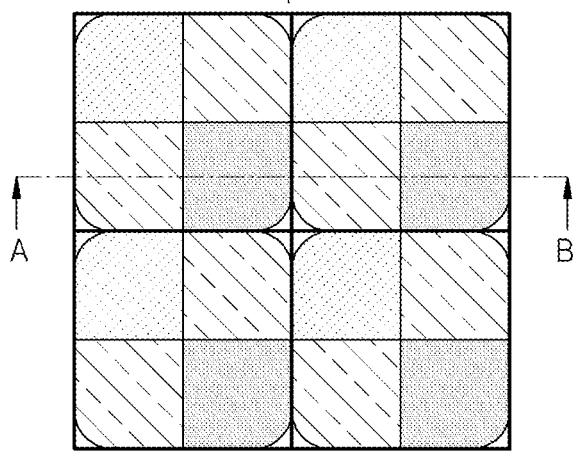
FIGS. 11A, 11B, and 11C illustrate pixel groups according to at least one example embodiment of inventive concepts.
Figure 11B:
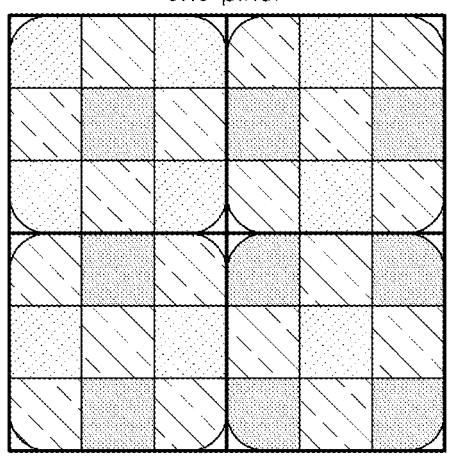
Figure 11C:
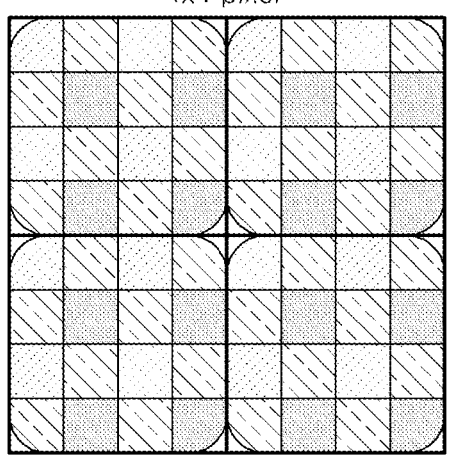

According to FIG. 10, a set of 2×2 or more pixels may be defined as one pixel group and one micro lens 6300 may be disposed to correspond to each pixel group. A pixel group may be defined in various forms. For example, a set of 2×2 pixels may be defined as one pixel group, as illustrated in FIG. 11A, a set of 3×3 pixels may be defined as one pixel group, as illustrated in FIG. 11B, or a set 4×4 pixels may be defined as one pixel group, as illustrated in FIG. 11C. FIG. 10 illustrates a case in which each pixel group includes a set of 2×2 pixels. The color filter array 6200 included in the CIS 6000 may have a Bayer structure including RGB filters.

One micro lens 6300 may be disposed on a plurality of filters. For example, one micro lens 6300 may be disposed on one pixel group including a set of 2×2 pixels. When light passes through one micro lens 6300 and a plurality of filters, light charges are accumulated in the photodiode 6100 and provided to a floating diffusion region FD through vias (not shown) disposed to correspond to the plurality of filters, respectively. Thus, a red color signal, a blue color signal, and first and second green color signals may be generated to correspond to one micro lens 6300.

To form a 3D image, depth information may be calculated by analyzing at least two pixel signals among four pixel signals generated from the set of 2×2 pixels. For example, pixel signals corresponding to filters passing the same color may be used to calculate the depth information. Thus, the depth information may be calculated by analyzing two filter signals corresponding to the first and second green filters. In FIG. 10, in the case of a pixel group including the set of 2×2 pixels, a first green pixel may be a left pixel and a second green pixel may be a right pixel among the set of 2×2 pixels. The depth information may be calculated by detecting an asymmetric degree between first and second pixel signals corresponding to the first and second green pixels.

As illustrated in FIG. 11B, one pixel group may include 3×3 pixels. Thus, nine pixels may be disposed to correspond to one micro lens 6300 and thus nine pixel signals may be generated. First to nine output voltages may be generated according to the nine pixel signals. Also, depth information may be calculated by analyzing at least two pixel signals among the nine pixel signals. For example, nine pixels belonging to one pixel group may include a plurality of color filters passing the same color of light, and thus, depth information may be calculated by analyzing pixel signals according to at least two color filters among the plurality of filters passing the same color of light. Also, sixteen pixels may be disposed to correspond to one micro lens 6300, as illustrated in FIG. 11C, and depth information may be calculated using at least some of sixteen pixel signals generated from the sixteen pixels to form a 3D image.

Figure 12:
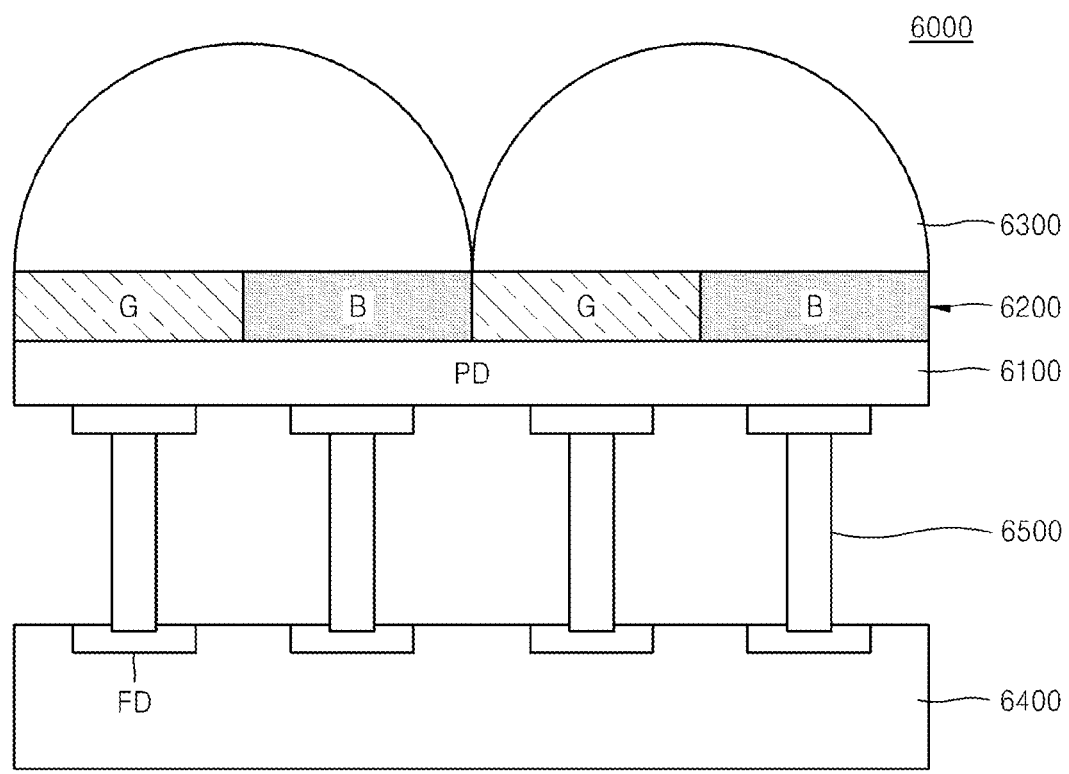
FIG. 12 illustrates an example of a cross-section of a pixel circuit of FIG. 11A.

FIG. 12 illustrates an example of a cross-section of a pixel circuit of FIG. 11A. FIG. 12 is a cross-sectional view taken along line A-B of the pixels of FIG. 11A.

As illustrated in FIG. 12, a plurality of filters may be disposed to correspond to one micro lens 6300. As one example, a green filter and a blue filter among a plurality of filters corresponding to one micro lens 6300 are illustrated in the cross-sectional view taken along line A-B of FIG. 11A.

A CIS 6000 of FIG. 12 may include a photodiode 6100 provided in the form of a thin film, a plurality of pixels 6200, and a plurality of micro lenses 6300 disposed such that one micro lens 6300 corresponds to two or more pixels. The CIS 6000 may further include a semiconductor substrate 6400 in which a floating diffusion region FD is formed, and a plurality of vias 6500 through which light charges accumulated in the photodiode 6100 are provided to the floating diffusion region FD.

As illustrated in FIG. 12, the plurality of vias 6500 may be formed to correspond to a plurality of pixels belonging to one pixel group. For example, when light passes through the plurality of pixels belonging to the pixel group, light charges are accumulated in the photodiode 6100 and provided to the floating diffusion region FD through the plurality of vias 6500. Depth information may be calculated by analyzing at least some color signals passing through the same micro lens 6300. For example, the depth information may be calculated using two or more pixel signals generated by, for example, filters for the same color of light.

Figure 13:
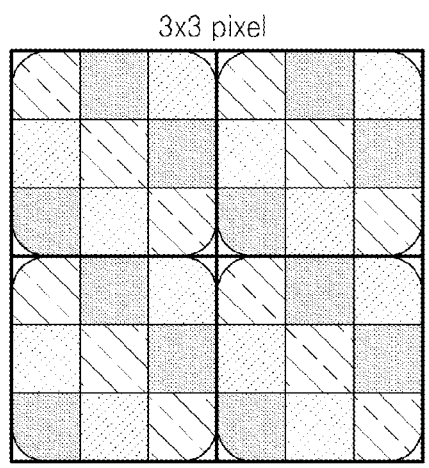
FIG. 13 illustrates a color filter array applied to a CIS according to at least one example embodiment of inventive concepts.

FIG. 13 illustrates a color filter array applied to a CIS according to at least one example embodiment of inventive concepts. FIG. 13 illustrates a non-Bayer type color filter array. Also, FIG. 13 illustrates a case in which a set 3×3 pixels are defined as one pixel group and each pixel group has the same color pattern. In particular, in the color filter array of FIG. 13, filters passing the same color of light may be arranged in a diagonal direction.

One micro lens may be disposed to correspond to the set of 3×3 pixels belonging to one pixel group. As one example, one pixel group may include three red filters, three green filters, and three red filters. A color signal may be generated to correspond to each of these color filters. Also, depth information may be calculated using at least two pixel signals among nine pixel signals corresponding to one micro lens.

In the color pixel array of FIG. 13, filters passing the same color of light may be disposed at different locations. For example, in FIG. 13, among green filters belonging to one pixel group, a first green filter may be an upper left filter, a second green filter may be a middle filter, and a third green filter may be a lower right filter. Depth information may calculated by analyzing whether pixel signals corresponding to the first to third green filters are symmetric to one another.

Although FIG. 13 illustrates a non-Bayer type color filter array including red, green, and blue filters, example embodiments of inventive concepts are not limited thereto. For example, one pixel group may be defined in various forms, e.g., a 2×2 pixel group, a 4×4 pixel group, etc. Also, a different color pattern such as a WRGB pattern may be applied to each pixel group.

Figure 14:
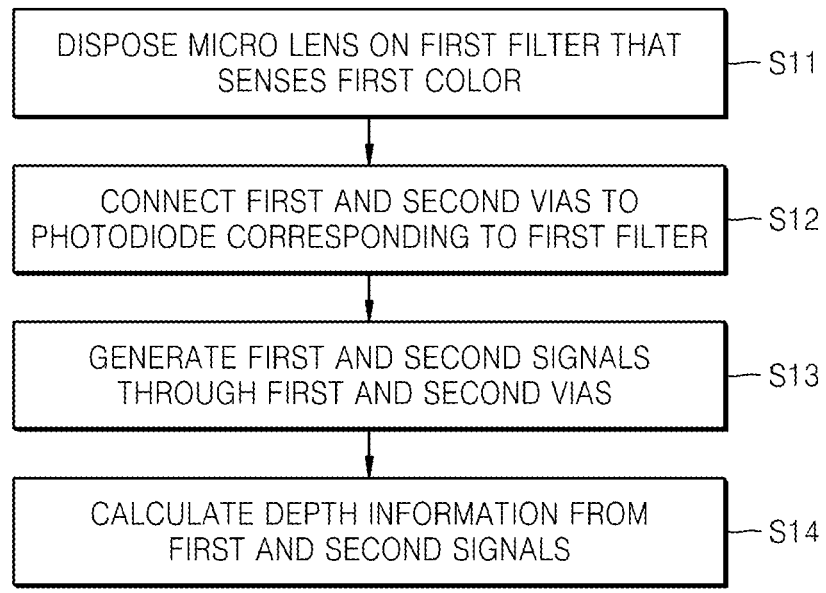
FIG. 14 is a flowchart of a method of operating a CIS, according to at least one example embodiment of inventive concepts.

FIG. 14 is a flowchart of a method of operating a CIS, according to at least one example embodiment of inventive concepts.

In operation S11, a micro lens is disposed on a filter passing a particular color of light, e.g., a first color (hereinafter, referred to as a first filter). The first filter may be divided into a plurality of sub-filters as in other example embodiments. For example, the plurality of sub-filters may be defined in various forms, e.g., a set of 2×2 sub-filters, a set of 3×3 sub-filter, a set of 4×4 sub-filters, etc.

A plurality of vias are disposed to correspond to one pixel. For example, a plurality of vias are disposed to correspond to a plurality of sub-filters, respectively. Thus, a plurality of pixel signals may be generated from one color filter. The plurality of pixel signals may be obtained by sensing the same color. For example, in operation S12, a thin film type photodiode may be disposed below the color filter array, and first and second vias may be disposed to correspond to one pixel and be electrically connected to the photodiode.

In operation S13, light charges accumulated in the photodiode through the micro lens and the color filter array are provided to a floating diffusion region via the first and second vias, and first and second signals are generated to correspond to the first and second vias. In operation S14, a color signal may be generated using at least one of the first and second signals, and depth information may be calculated by analyzing a symmetric degree between the first and second signals.

Figure 15:
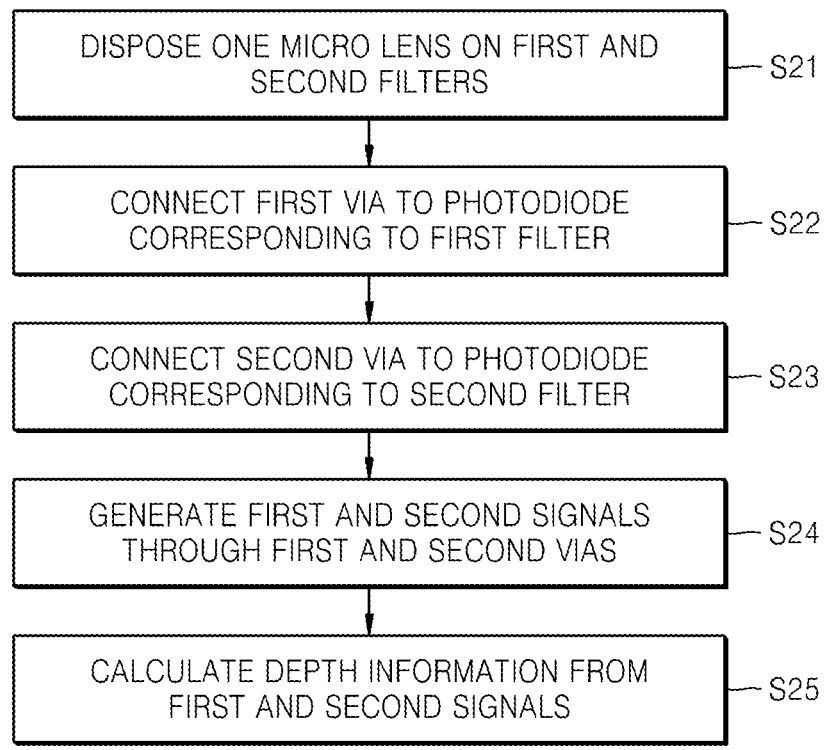
FIG. 15 is a flowchart of a method of operating a CIS, according to at least one example embodiment of inventive concepts.

FIG. 15 is a flowchart of a method of operating a CIS, according to at least one example embodiment of inventive concepts.

In operation S21, one micro lens is disposed on two or more filters (hereinafter, referred to as first and second filters). A plurality of filters may form one filter group as in other example embodiments. For example, one filter group may be defined in various forms, e.g., a set of 2×2 pixels, a set of 3×3 pixels, a set of 4×4 pixels, etc. The first and second filters may be filters that belong to one filter group and pass the same color.

A first via and a second via are disposed to correspond to the first and second filters disposed below the same micro lens, respectively. In operation S22, when light charges are accumulated in a thin film type photodiode through the micro lens and the first and second filters, the first via is electrically connected to a photodiode region corresponding to the first filter and the light charges are provided to a floating diffusion region via the first via. Similarly, in operation S23, the second via is electrically connected to a photodiode region corresponding to the second filter and the light charges are provided to the floating diffusion region via the second via.

In operation S24, a first signal and a second signal are generated from the light charges provided via the first and second vias. The first and second filters belong to the same filter group and pass a same color, and an output voltage may be generated as a sensing result from at least one of the first and second signals. In operation S25, the first and second signals may be used to calculate depth information, for example, by analyzing a symmetric degree between the first and second signals.

Figure 16:
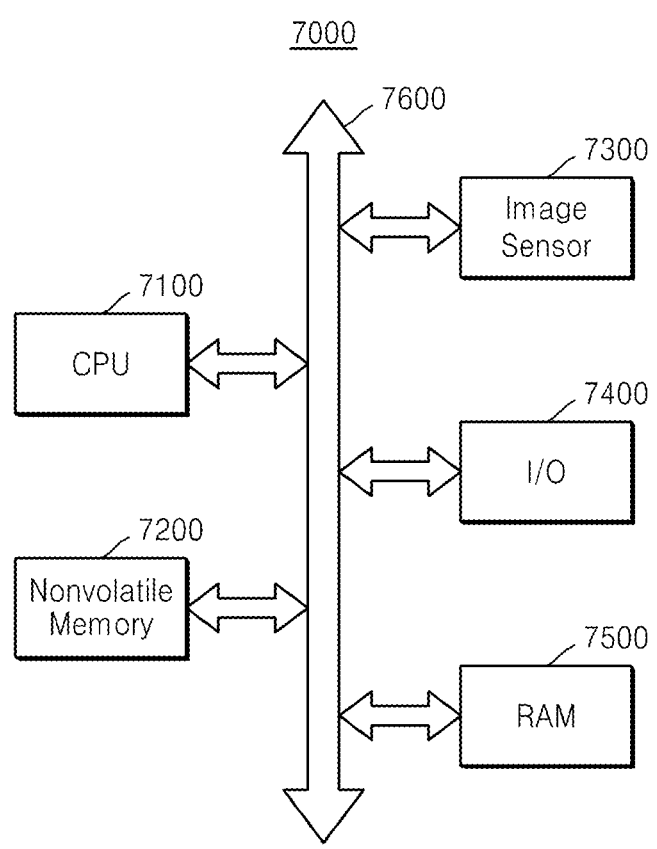
FIG. 16 is a block diagram of a system including a CIS according to at least one example embodiment of inventive concepts.

FIG. 16 is a block diagram of a system 7000 including a CIS 7300 according to at least one example embodiment of inventive concepts. The system 7000 may be a system that uses image data such as a computing system, a mobile device such as a smart phone, a camera system, a scanner, a vehicle navigation system, a video phone, a security system, and a motion detection system.

As illustrated in FIG. 16, the system 7000 may include a central processing unit (CPU) (or a processor) 7100, a non-volatile memory 7200, the CIS 7300, an input/output (I/O) device 7400, and random access memory (RAM) 7500. The CPU 7100 may communicate with the nonvolatile memory 7200, the CIS 7300, the I/O device 7400, and the RAM 7500 via a bus 7600. The CIS 7300 may be embodied as an independent semiconductor chip or combined with the CPU 7100 to form one semiconductor chip. The CIS 7300 included in the system 7000 of FIG. 16 may include a micro lens as described above according to example embodiments of inventive concepts. For example, one micro lens may be disposed to correspond to, for example, one pixel, the pixel may be divided into a plurality of sub-pixels, and a plurality of vias may be formed to correspond to the plurality of sub-pixels, respectively. Depth information may be calculated using pixel signals corresponding to the plurality of sub-pixels. For example, one micro lens may be disposed to correspond to a pixel group including a plurality of pixels, and depth information may be calculated by analyzing at least two pixel signals of the pixel group.

Figure 17:
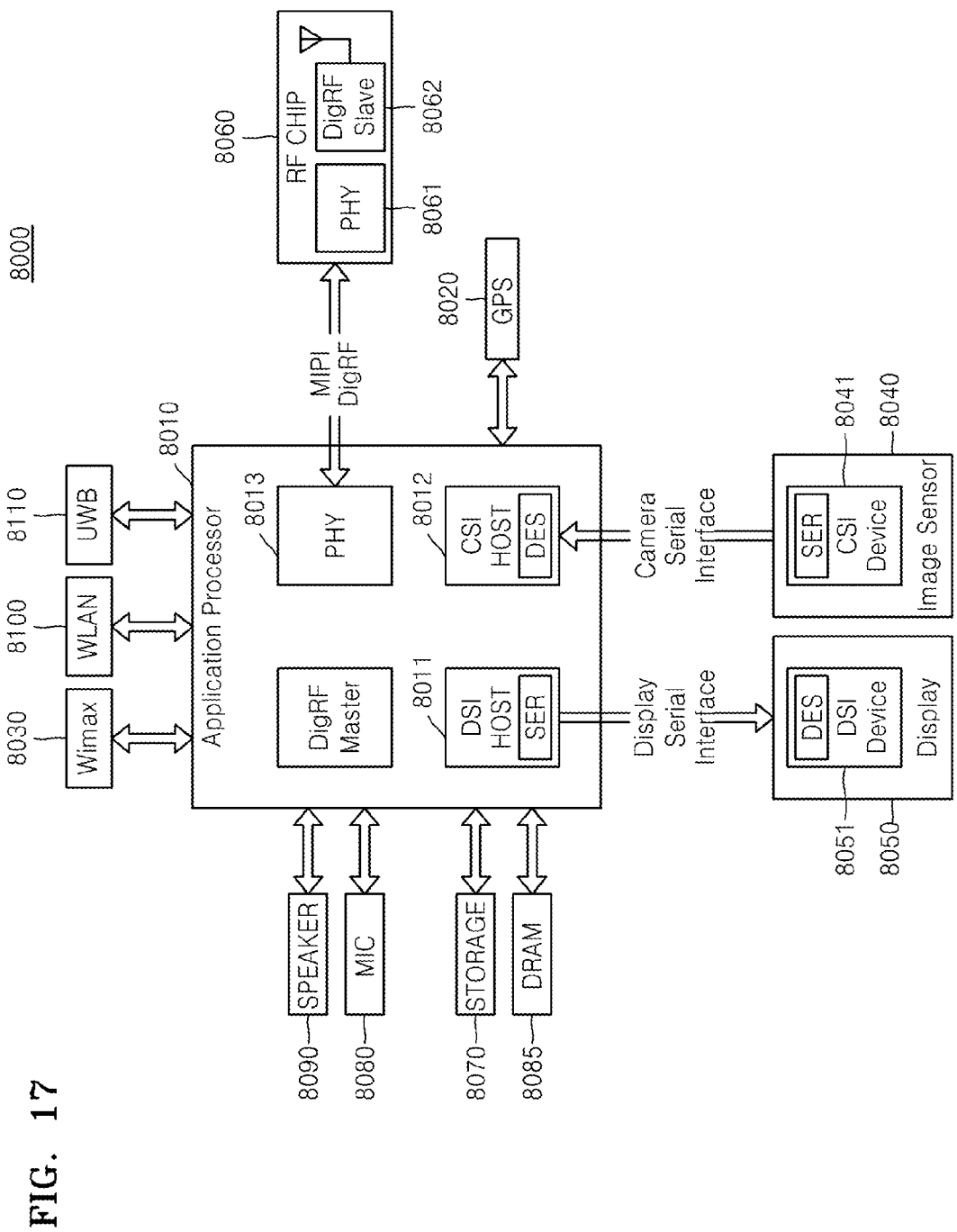
FIG. 17 illustrates an electronic system including a CIS and an interface according to at least one example embodiment of inventive concepts.

FIG. 17 illustrates an electronic system 8000 including a CIS 8040 and an interface according to at least one example embodiment of inventive concepts. Referring to FIG. 17, the electronic system 8000 may be embodied as a data processing device capable of using or supporting a mobile industry processor interface (MIPI) interface, e.g., a mobile phone, a personal digital assistant (PDA), a portable multimedia player (PMP), or a smart phone. The electronic system 8000 may include an application processor 8010, the CIS 8040, and a display 8050.

A CSI host 8012 included in the application processor 8010 may establish serial communication with a camera serial interface (CSI) device 8041 of the CIS 8040 via a CSI. In this case, for example, an optical deserializer may be included in the CSI host 8012, and an optical serializer may be included in the CSI device 8041.

A display serial interface (DSI) host 8011 included in the application processor 8010 may establish serial communication with a DSI device 8051 of the display 8050 via a DSI. In this case, for example, an optical serializer may be included in the DSI host 8011, and an optical deserializer may be included in the DSI device 8051.

The electronic system 8000 may further include a radio-frequency (RF) chip 8060 capable of communicating with the application processor 8010. Data may be exchanged between a physical layer (PHY) 8013 of the electronic system 8000 and a PHY 8061 of the RF chip 8060 according to MIPI DigRF protocol.

The electronic system 8000 may further include a global positioning system (GPS) 8020, a storage unit 8070, a microphone 8080, DRAM 8085, and a speaker 8090. The electronic system 8000 may establish communication using a World Interoperability for Microwave Access (Wimax) unit 8030, a wireless local area network (WLAN) unit 8100, an ultra-wide band (UWB) unit 8110, etc.

While inventive concepts have been particularly shown and described with reference to example embodiments thereof, it will be understood that various changes in form and details may be made therein without departing from the spirit and scope of the following claims.

What is claimed is:
1. A complementary metal-oxide semiconductor (CMOS) image sensor comprising:

at least one floating diffusion region in a semiconductor substrate;

a thin film type light sensor disposed to correspond to a plurality of pixels;

at least one via electrically connected between the light sensor and the at least one floating diffusion region; and a first micro lens disposed to correspond to at least two pixels of the plurality of pixels such that light entering the first micro lens is directed toward the at least two pixels.

2. The CMOS image sensor of claim 1, further comprising:
a color filter array disposed to correspond to the plurality of pixels.

3. The CMOS image sensor of claim 1, wherein the at least two pixels corresponding to the first micro lens include a first sub-pixel and a second sub-pixel sensing the same color of light, and pixel signals from the first and second sub-pixels are used to calculate depth information.

4. The CMOS image sensor of claim 1, wherein the at least two pixels include 'n' sub-pixels disposed to correspond to the first micro lens, wherein, 'n' denotes an integer that is equal to or greater than '2', and
the at least one via includes 'n' vias disposed to correspond to the 'n' sub-pixels, respectively.

5. The CMOS image sensor of claim 1, wherein the at least two pixels form a filter group, and wherein the filter group includes a first filter and a second filter that pass the same color of light.

6. The CMOS image sensor of claim 5, wherein the at least one via includes a plurality of vias disposed to correspond to a plurality of filters belonging to the filter group, respectively.

7. The CMOS image sensor of claim 5, wherein the filter group includes n×n pixels, and wherein 'n' denotes an integer that is equal to or greater than '2'.

8. The CMOS image sensor of claim 7, wherein the n×n pixels have a Bayer pattern including red, green, and blue filters.

9. The CMOS image sensor of claim 1, further comprising:
a second micro lens disposed to correspond to at least two different pixels of the plurality of pixels, and wherein the at least two pixels corresponding to the first micro lens include filters for passing a first color of light, and the at least two different pixels corresponding to the second micro lens include filters for passing a second color of light.

10. The CMOS image sensor of claim 1, further comprising:
a second micro lens disposed to correspond to at least two different pixels of the plurality of pixels, and a color pattern of the at least two pixels corresponding to the first micro lens is the same as a color pattern of the at least two different pixels corresponding to the second micro lens.

11. The CMOS image sensor of claim 1, wherein 'n' pixels are disposed to correspond to the first micro lens, wherein 'n' denotes an integer that is equal or greater than '2', and pixels signals from pixels sensing the same color among the 'n' pixels are used to calculate depth information.

12. A method of operating a complementary metal-oxide semiconductor (CMOS) image sensor, the method comprising:

providing light charges, which are accumulated in a thin film type light sensor when light passes through a first micro lens and a first filter, to a first floating diffusion region through a first via, the thin film type light sensor being disposed to correspond to a plurality of pixels;

providing light charges, which are accumulated in the thin film type light sensor when light passes through the first micro lens and a second filter, to a second floating diffusion region through a second via;

generating a first pixel signal corresponding to the light charges accumulated in the first floating diffusion region, and a second pixel signal corresponding to the light charges accumulated in the second floating diffusion region; and calculating depth information based on the first and second pixel signals.

13. The method of claim 12, wherein the first and second filters are filters for passing a first color of light.

14. The method of claim 13, wherein at least one of the first and second filters is further disposed to correspond to the first micro lens and to pass a second color of light that is different from the first color of light.

15. The method of claim 12, wherein at least one of the plurality of pixels includes a plurality of sub-pixels, and the first and second filters correspond to a first sub-pixel and a second sub-pixel of the at least one pixel, respectively.

16. An image sensor, comprising:
a substrate including a first charge collection region and a second charge collection region, the first charge collection region being configured to collect first charges, the second charge collection region being configured to collect second charges;

a light sensor on the first and second charge collection regions and configured to generate the first and second charges based on incident light; and a micro lens on the light sensor and aligned with the first and second charge collection regions such that light entering the micro lens is directed toward the first and second charge collection regions.

17. The image sensor of claim 16, further comprising:
a first conductive plug electrically connecting the light sensor to the first charge collection region; and a second conductive plug electrically connecting the light sensor to the second charge collection region.

18. The image sensor of claim 16, wherein the first charge collection region is associated with a first pixel configured to detect a first color of light, and the second charge collection region is associated with a second pixel configured to detect a second color of light, different from the first color of light.

19. The image sensor of claim 16, wherein the first charge collection region is associated with a first sub-pixel and the second charge collection region is associated with a second sub-pixel, the first and second sub-pixels being configured to detect a same color of light.

20. The image sensor of claim 19, further comprising:
an image signal processor configured to,
receive a first pixel signal based on the first charges collected by first charge collection region and a second pixel signal based on the second charges collected by the second charge collection region, and calculate depth information based on the received first and second pixel signals.

* * * * *